United States Patent [19]

Nishi

[11] Patent Number: 4,829,193

[45] Date of Patent: May 9, 1989

[54] PROJECTION OPTICAL APPARATUS WITH FOCUSING AND ALIGNMENT OF RETICLE AND WAFER MARKS

[75] Inventor: Kenji Nishi, Kawasaki, Japan

[73] Assignee: Nikon Corporation, Tokyo, Japan

[21] Appl. No.: 94,448

[22] Filed: Sep. 9, 1987

[30] Foreign Application Priority Data

Sep. 12, 1986 [JP] Japan .................................. 61-214091

[51] Int. Cl.[4] ...................... G01N 21/86; G01B 11/00
[52] U.S. Cl. .................................... 250/548; 250/557; 356/400
[58] Field of Search ................................ 250/548, 557; 356/399–401

[56] References Cited

U.S. PATENT DOCUMENTS 4,395,117 7/1983 Suzuki .................................... 355/43
4,642,468 2/1987 Tabata et al. ......................... 250/557

Primary Examiner—David C. Nelms
Assistant Examiner—Stephone B. Allen
Attorney, Agent, or Firm—Shapiro and Shapiro

[57] ABSTRACT

An optical apparatus is provided with illuminating means provided on one side of an objective optical system having a pupil substantially at infinity, that is, telecentric, with a first object interposed therebetween for illuminating a first pattern on the first object, detecting means provided on the other side of the objective optical system with a second object interposed therebetween for outputting the information regarding the aligned state of the image of the first pattern by the objective optical system and a second pattern on the second object, light changing-over means provided at a position between the illuminating means and the detecting means and conjugate with the pupil for selectively changing over light passing through a plurality of substantially different areas on the pupil and directing the light to the detecting means, adjusting means for varying the length of the optical path between the first object and the second object, and control means for varying the length of the optical path by a predetermined amount by the adjusting means and effecting the change-over of the light changing-over means before and after the variation and effecting the positioning of the first object and the second object on the basis of the output information of the detecting means in each of these cases.

11 Claims, 6 Drawing Sheets

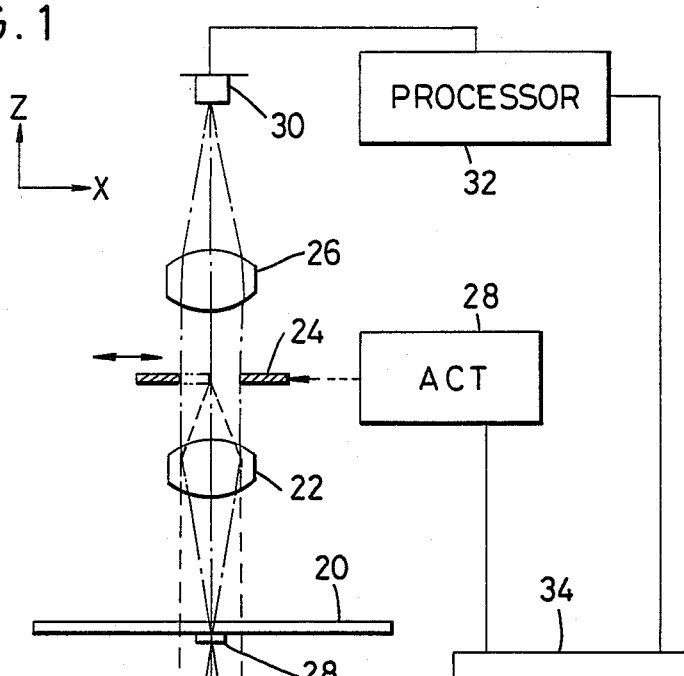
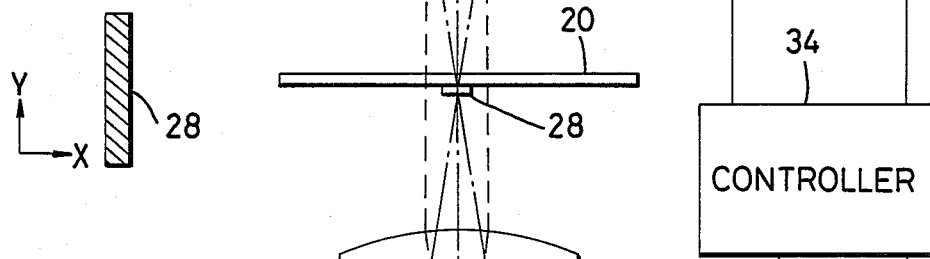
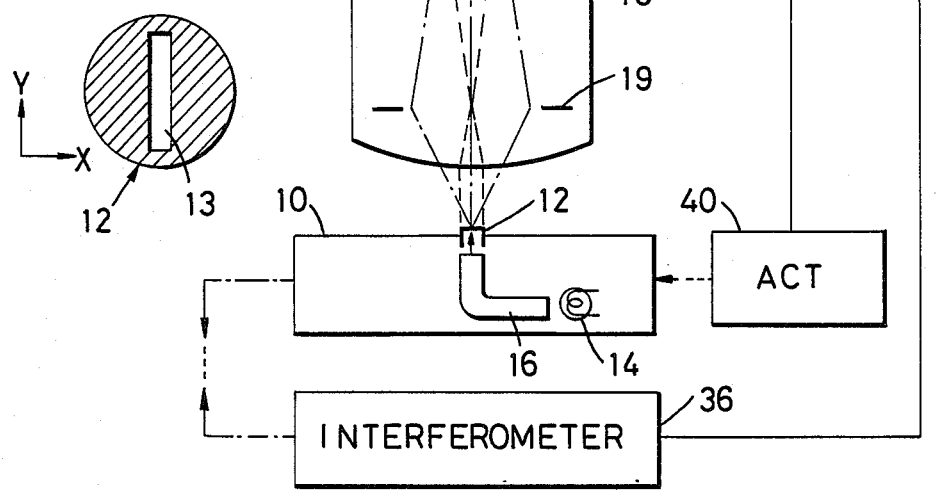
FIG. 1
FIG. 3
FIG. 2

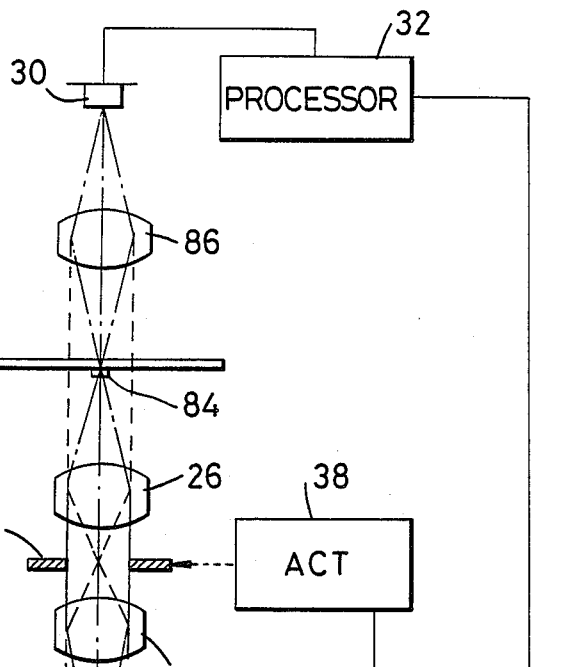
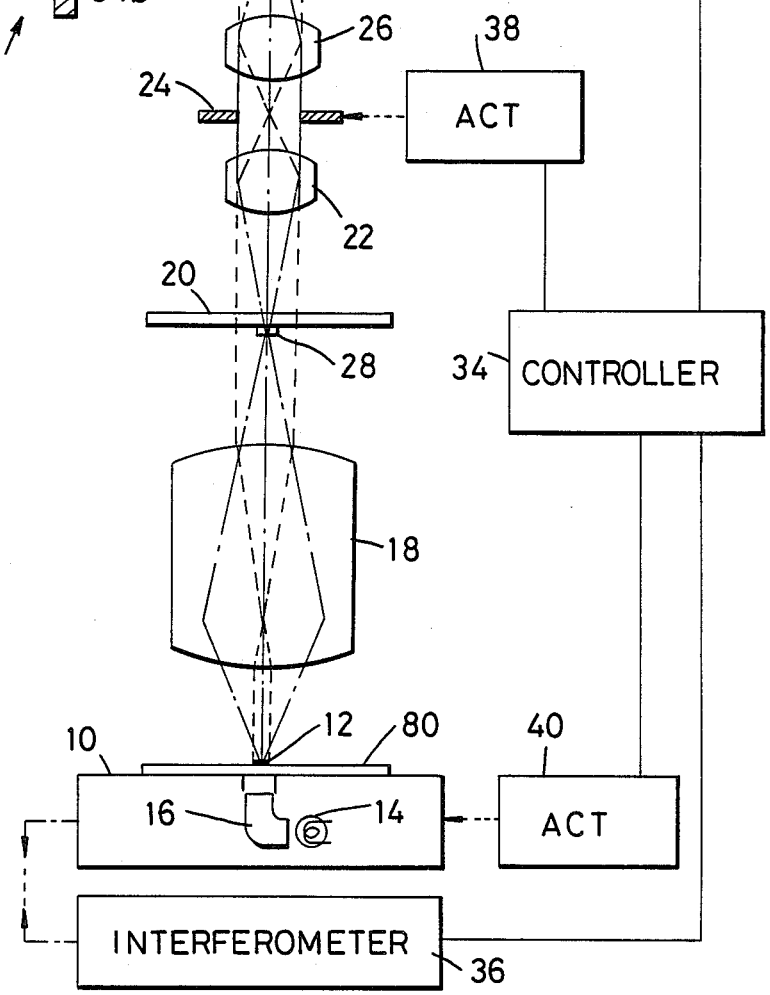

PROJECTION OPTICAL APPARATUS WITH FOCUSING AND ALIGNMENT OF RETICLE AND WAFER MARKS

BACKGROUND OF THE INVENTION

1. Field of the Invention

This invention relates to an optical apparatus, for example, an optical apparatus in an exposure apparatus which effects focusing, alignment, etc. of a mask pattern and a projected substrate to a projection optical system.

2. Related Background Art

The focusing and alignment system in the prior art exposure apparatus, as disclosed, for example, in U.S. Pat. No. 4,395,117, is of a construction in which both of an illuminating system from which an illuminating light is output and a light-receiving system to which the reflected light or the detection light is input are present on the mask or reticle side which is one object side.

That is, it is of a construction in which the illuminating light beam incident from the reticle side enters a wafer which is the other object side through a reticle and a projection optical system and is reflected thereby and transmitted through the projection optical system and the reticle and again returns to the incidence side.

Therefore, it is necessary to divide the incident light and the reflected light or the detection light by the use of light dividing means such as a half-mirror. This leads to a considerable loss of quantity of light, which in turn leads to the inconvenience that sufficient alignment accuracy or focusing accuracy cannot be obtained.

SUMMARY OF THE INVENTION

It is an object of the present invention to provide an optical apparatus in which the accuracy of focusing and alignment can be improved.

The apparatus of the present invention is provided with illuminating means provided on one side of an objective optical system having a pupil substantially at infinity, that is, telecentric, with a first object interposed therebetween for illuminating a first pattern on said first object, detecting means provided on the other side of said objective optical system with a second object interposed therebetween for outputting the information regarding the aligned state of the image of said first pattern by said objective optical system and a second pattern on said second object, light changing-over means provided at a position between said illuminating means and said detecting means and conjugate with said pupil for selectively changing over light passing through a plurality of substantially different areas on said pupil and directing said light to said detecting means, adjusting means for varying the length of the optical path between said first object and said second object, and control means for varying the length of the optical path by a predetermined amount by said adjusting means and effecting the change-over of said light changing-over means before and after said variation and effecting the positioning of said first object and said second object on the basis of the output information of said detecting means in each of these cases.

BRIEF DESCRIPTION OF THE DRAWINGS

FIG. 1 shows the construction of a first embodiment of the present invention.

FIG. 2 is a plan view showing a fiducial mark.

FIG. 3 is a plan view showing a reticle mark.

FIG. 9 shows the construction of a third embodiment of the present invention.

FIG. 10 is a plan view showing an index mark.

DESCRIPTION OF THE PREFERRED EMBODIMENTS

Figure 4:
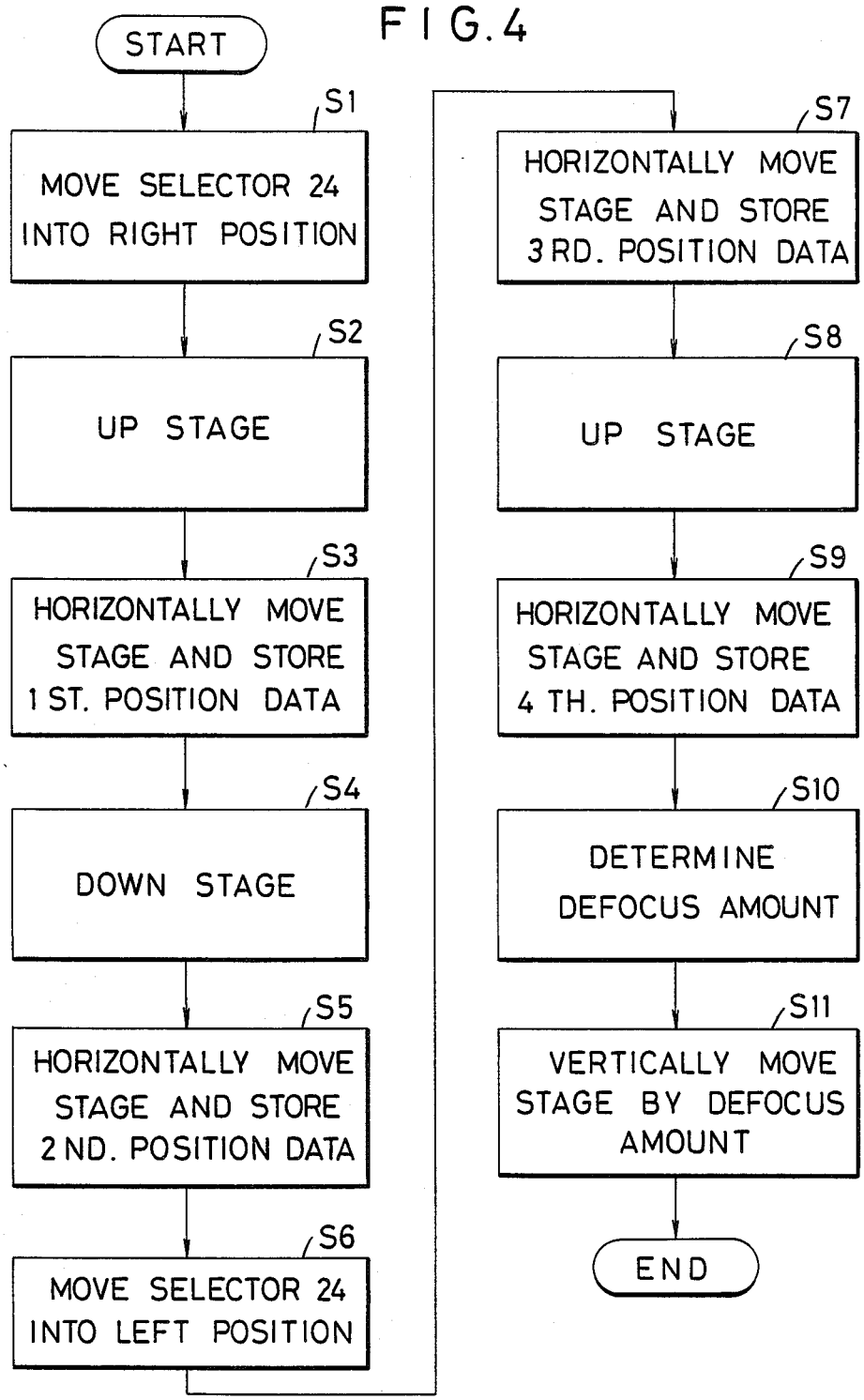
FIG. 4 is a flow chart showing the operation of the first embodiment.

In FIG. 1, there is shown a first embodiment of the present invention. In this figure, a fiducial mark 12 is provided at a suitable position, for example, on a stage 10 on which a semiconductor wafer is placed.

A light source 14 is disposed inside (or outside) the stage 10 and the light of the light source 14 is designed to illuminate the fiducial mark 12 from below it by an optical fiber 16. It is desirable that the light of the light source 14 illuminate the mark 12 through an interference filter so as to be a light of the same wavelength as working light emitted from light source, not shown, to work the wafer placed on the stage through a projection optical system 18.

The fiducial mark 12, as shown in FIG. 2, comprises a light-intercepting member having a rectangular light transmitting slit 13, and a light beam incident thereon emerges as a sheet-like light beam. The level of the fiducial mark 12 relative to the stage 10 corresponds to the surface position of the semiconductor wafer placed on the stage 10. Thus, when the fiducial mark 12 and a reticle mark 28 are set at an in-focus position relative to the projection optical system 18, the wafer and a reticle are set at the in-focus position.

Above the stage 10, a reticle 20 is disposed through the projection optical system 18 at least the wafer (image) side of which is telecentric, and a telecentric first objective lens 22, a light selector 24 for effecting pupil division and a second objective lens 26 are disposed above the reticle 20. The light transmitted through the marginal portion of the reticle mark 28 formed on the reticle 20 passes through these optical elements to a light-receiving element 30.

The reticle mark 28, as shown in FIG. 3, provides a rectangular light-intercepting portion corresponding to the slit 13 of the above-described fiducial mark 12.

The light selector 24 is disposed at a position equivalent to the pupil 19 of the projection optical system so as to be movable in the direction of the arrow, and has a substantially rectangular opening at the center thereof. Part of the light beam passed through the reticle 20 to the objective lens 22, for example, the left half of such light beam, is intercepted by the rightward movement of the selector and therefore, the telecentricity of said light beam is bent.

The light-receiving element 30 is connected to a signal processor 32 which in turn is connected to a controller 34.

A coordinates position measuring interferometer 36 is provided on the above-described stage 10 and the measurement output of this interferometer 36 is input to the controller 34.

Further, an actuator 38 for driving the light selector 24 and an actuator 40 for driving the stage 10 in directions X, Y and Z are connected to the controller 34.

The general operation of the above-described embodiment will now be described. This operation includes a sequence for rendering the reticle 20 and the fiducial mark 12 conjugate with the projection optical system 18 (positioning in direction Z) and a sequence for alignment (positioning in directions X and Y).

The sequence for the positioning in direction Z will first be described with reference to a flow chart shown in FIG. 4.

Of the light beam passed through the pupil 19 of the projection optical system 18, for example, the right half is first intercepted. This operation is accomplished by the light selector 24 being moved rightwardly by the actuator 28 based on the instruction from the controller 34 and placed at a position indicated by a phantom line (step S1 of FIG. 4). By this operation, the principal ray is inclined with respect to the optic axis of the projection optical system 18. Therefore, the reticle side focus position or the imaging position of the projection optical system 8 when the stage 10 is moved in the direction of Z-axis, i.e., in a vertical direction as viewed in FIG. 1, fluctuates in direction X which is orthogonal to Z-axis.

In the above-described state, an instruction is given from the controller 34 to the stage actuator 40 and the stage 10 is moved in direction Z (upwardly) by $+4$ μm, for example, from its referential level and is set at a defocus position (step S2).

Figure 5:
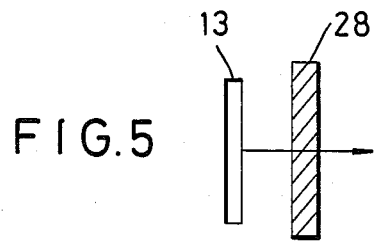
FIG. 5 illustrates the state of scanning of the reticle mark by a slit.

Hereupon, a driving instruction is output to the stage actuator 40 by the controller 34, whereby the stage 10 is rectilinearly moved in a horizontal direction. As a result, as shown in FIG. 5, the slit 13 of the fiducial mark 12 is moved relative to the reticle mark 28 in the direction of the arrow.

Figure 6:
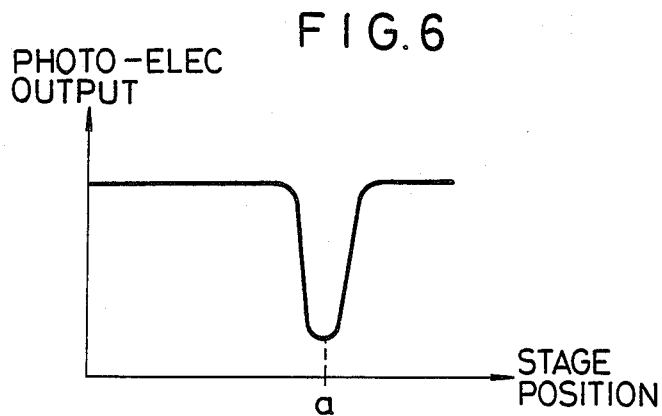
FIG. 6 is a graph showing the waveform of a photoelectric signal.

Thus, the photoelectric output of the light-receiving element 30 is such as shown in FIG. 6, relative to the position of the stage 10. In this figure, the position a is a state in which the reticle mark 28 and the slit 13 have most overlapped each other. The controller 34 records in a memory device therein the position of the stage measured by the interferometer 36 when it receives the output of this state from the processor, as first position data (step S3).

Subsequently, an instruction is given from the controller 34 to the stage actuator 40, and the stage 10 is moved by a suitable amount, for example, by $-4$ μm in direction Z (downwardly) from the referential level and is set at the defocus position (step S4). As in the aforedescribed step S3, a driving instruction is given from the controller 34 to the stage actuator 40 and the stage 10 is horizontally moved, and the position of the stage when the reticle mark and the slit overlap each other is recorded as second position data (step S5).

Figure 7:
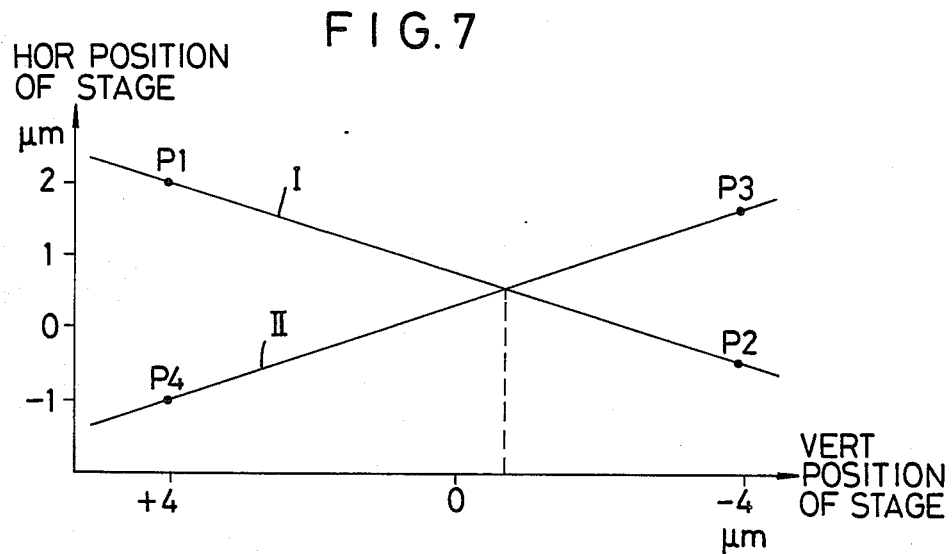
FIG. 7 is a graph for finding the in-focus position.

The first and second position data measured in the above-described manner may be graphically represented as points P1 and P2 in FIG. 7. The ordinate of this graph represents the horizontally moved position of the stage and the abscissa represents the moved position of the stage in direction Z, i.e., in a vertical direction. The inclination of a straight line I passing through the two points P1 and P2 corresponds to the amount of deviation of telecentricity by one half of the light beam on the pupil being intercepted.

Next, of the light beam passed through the pupil 19 of the projection optical system, the left half as viewed in FIG. 1 is intercepted. This operation is accomplished by the light selector 24 being moved leftwardly by the actuator 28 based on the instruction from the controller 34 (step S6). In the horizontal movement of the lowered stage and the horizontal movement of the again elevated stage, operations similar to steps S3 and S5 are performed and third and fourth position data regarding the position of the stage are recorded (steps S7–S9). The inclination of a straight line II passing through measurement points P3 and P4 found in this manner corresponds to the amount of deviation of telecentricity by the other half of the light beam on the pupil being intercepted.

The point of intersection between the two straight lines I and II can be a position in which no image shift takes place, i.e., the in-focus position, and therefore the difference between this position and a position providing a predetermined reference is determined as the amount of defocus (step S10). Then, the stage 10 is moved by this amount of defocus in the direction of Z-axis by the stage actuator 40.

In the manner described above, the fiducial mark 12 and the reticle mark 28 are set at a position conjugate with the projection optical system 18, and positioning in direction Z (focusing) is completed.

Alignment in directions X and Y will now be described.

A driving instruction is given from the controller 34 to the stage actuator 40, and horizontal movement of the stage 10 is effected. As described in connection with FIG. 5, by the relative scan between the slit 13 and the reticle mark 28, the variation in quantity of light when the two overlap each other is detected by the light-receiving element 30 in synchronism with the measured value by the interferometer 36.

In this case, the light selector 24 is retracted from the optical path so as not interrupt the pupil surface.

By the output waveform signal of the light-receiving element 30 obtained in the above-described manner, the signal processor 32 measures the amount of deviation of the reticle mark 28 relative to the movement coordinates system of the stage 10, and the alignment offset of the reticle 20 relative to the apparatus is stored in the controller 34.

A second embodiment of the present invention will now be described with reference to FIG. 8. In the second embodiment, portions similar to those of the above-described first embodiment are given similar reference numerals.

The above-described first embodiment is of the slit light emission type in which light is output from the slit of the fiducial mark, whereas this second embodiment is of the slit light reception type in which light is received by the slit of the fiducial mark, and in this embodiment, a light-receiving element is provided below the slit.

Figure 8:
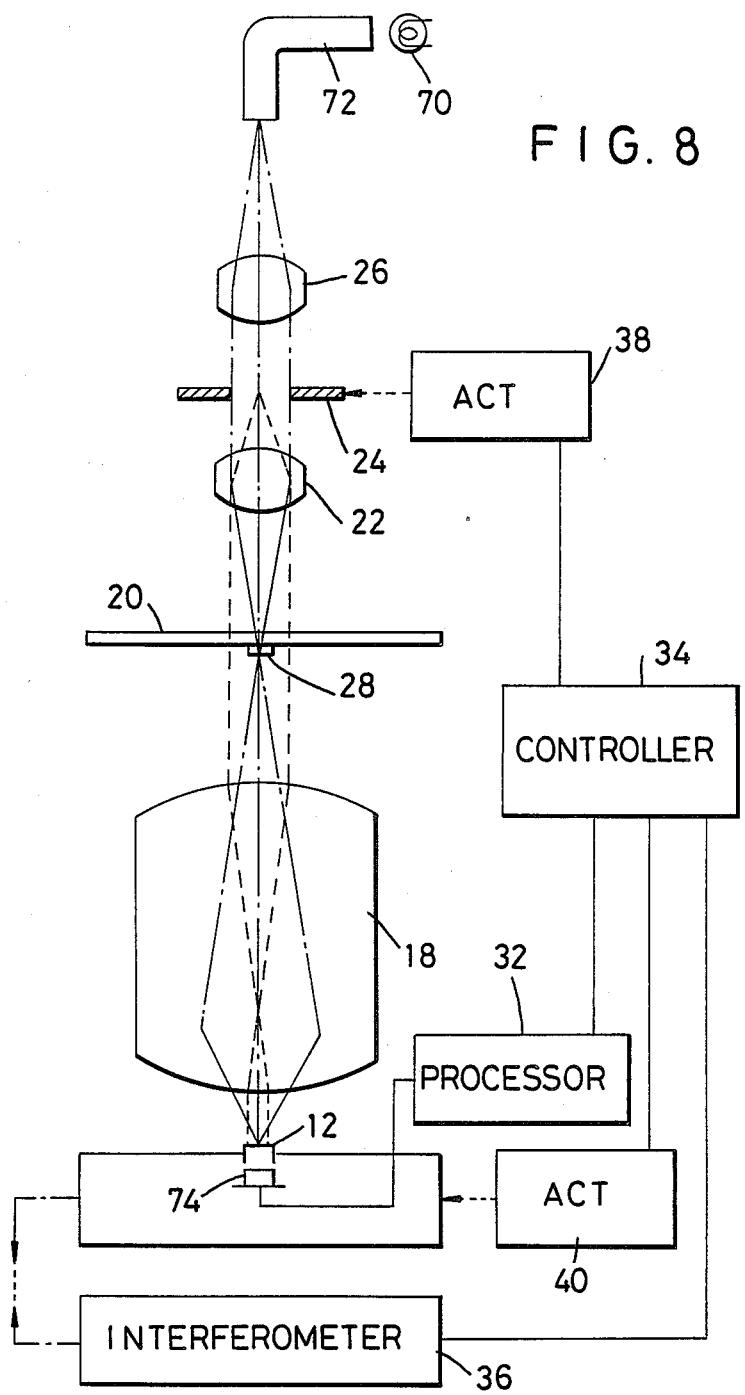
FIG. 8 shows the construction of a second embodiment of the present invention.

In FIG. 8, the illuminating light for focusing or alignment is output from a light source 70 disposed above a second objective lens 26 and is directed toward the optical system by an optical fiber 72.

The illuminating light transmitted through the slit of the fiducial mark 12 enters a light-receiving element 74 disposed in the stage 10 and is converted into a photoelectric signal thereby. Again in the case of the present embodiment, focus detection can be likewise accomplished with the light beam on the pupil changed over by the use of the selector 24.

A third embodiment of the present invention will now be described with reference to FIGS. 9 and 10. In this third embodiment, as in the second embodiment, portions similar to those of the first embodiment are given similar reference numerals.

This embodiment is applied in a case where focusing or alignment between a plurality of marks is effected.

In FIG. 9, a substrate 80 (a glass plate or the like) of a transparent material is placed on the stage 10, and an optical fiber 16 is provided at a predetermined position on the stage 10 so as to illuminate the lower surface of the substrate 80. A fiducial mark 12 having a rectangular slit 13 as described in connection with FIG. 2 is formed on the light-intercepting portion of chromium or like material of the substrate 80.

An index mark 84 and a condensing lens 86 are disposed between the second objective lens 26 movable in the direction of the optic axis and the light-receiving element 30. The index mark 84 comprises two linear marks disposed parallel to each other as shown, for example, in FIG. 10.

Figure 11:
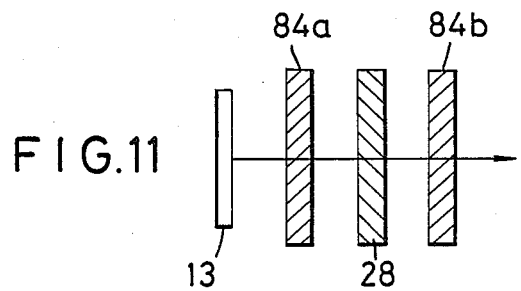
FIG. 11 illustrates the state of scanning of the reticle mark and index mark by a slit.
Figure 12:
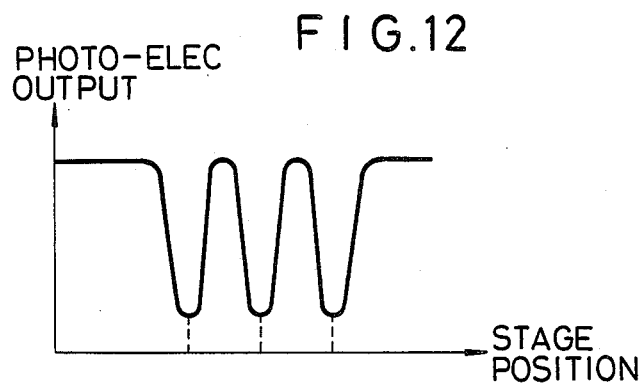
FIG. 12 is a graph showing the waveform of a photoelectric signal.

The operation of the above-described embodiment will now be described. On the basis of the flow chart shown in FIG. 4, the light selector 24 is moved and the scanning of the slit 13 as shown in FIG. 11 relative to the marks 28 and 84 is effected, whereby there is obtained a photoelectric signal as shown in FIG. 12.

Figure 13:
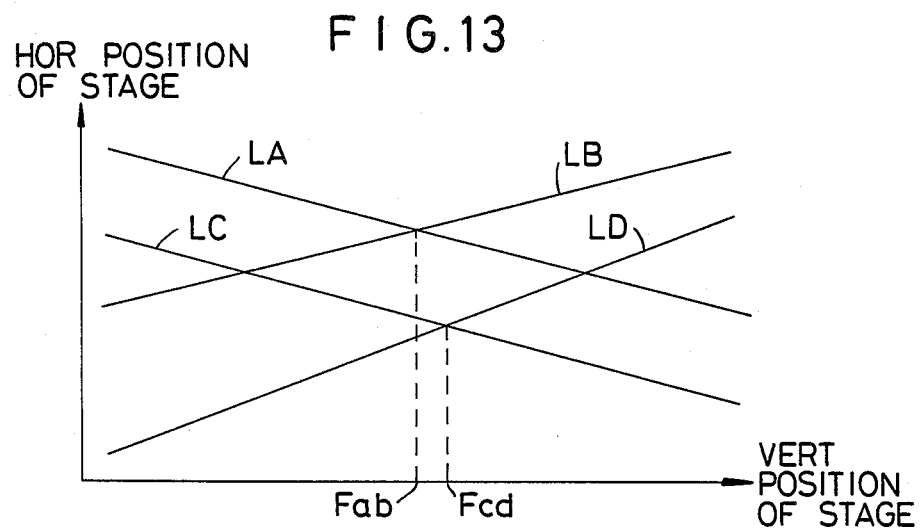
FIG. 13 is a graph for finding the in-focus position.

First, the graphs LA and LB of the in-focus position as shown in FIG. 13 are found from the photoelectric signal made by the slit 13 and the reticle mark 28, and the position of the stage corresponding to the point of intersection Fab therebetween is determined. By adjusting the level of the stage 10 to the thus determined position, focusing of the reticle 20 and the substrate 80 is effected.

Subsequently, the graphs LC and LD of the infocus position are found from the photoelectric signal made by the slit 13 of the fiducial mark 12 and the index mark 84, and the position of the stage corresponding to the point of intersection Fcd therebetween is determined. The second objective lens 26 is moved along the optic axis by an amount corresponding to the difference between the points of intersection Fab and Fcd, whereby focusing of the index mark 84 and the substrate 80 is effected.

As described above, according to the third embodiment, even in a case where conjugate objects are present at a plurality of positions, all the amounts of defocus can be obtained by only the measurement of four points and also alignment can be accomplished, and this is very effective.

In each of the above-described embodiments, the inclination of the principal ray has been measured by moving the light selector 24 to the right position and the left position to determine the in-focus position. However, the principle of the present invention is based on the phenomenon that in a telecentric system, when the principal ray which should originally be parallel to the optic axis is inclined with respect to the optic axis by the use of a light selector, the principal ray is rotatively displaced about an axis (an axis arthogonal to the optic axis), and this axis of rotation is the in-focus position corresponding the point of intersection between the two straight lines I and II of FIG. 7. Accordingly, the in-focus position can also be determined from the data of photoelectric detection in a state in which the principal ray is maintained parallel to the optic axis without the use of the light selector 24 and the data of photoelectric detection in a state in which the light selector 24 has been moved to one of the right position and the left position.

What is claimed is:

1. An optical apparatus comprising:
   an objective optical system having an exit pupil substantially at infinity;
   illuminating means for supplying a light beam passing through a determined position on a first plane intersecting an optical axis of said objective optical system and entering said objective optical system;
   means for producing first data relating to an inclination of a principal ray of a part of said light beam emitted from said objective optical system which passes through a first area on said exit pupil;
   means for producing second data relating to an inclination of a principal ray of a part of said light beam emitted from said objective optical system which passes through a second area substantially different from said first area on said exit pupil; and
   means for determining a position of a second plane conjugate with said first plane with respect to said objective optical system on the basic of said first and second data.

2. An optical apparatus according to claim 1, wherein at least one of said first and second areas is eccentric with respect to said optical axis.

3. An optical apparatus according to claim 1, wherein said first data producing means includes first output means responding to said part of said light beam passing through said first area for producing a corresponding output, and said second data producing means includes second output means responding to said part of said light beam passing through said second area for producing a corresponding output.

4. An optical apparatus according to claim 1 further comprising means for supporting a first object on said first plane and means for supporting a second object on said second plane in accordance with said determined position of said second plane.

5. An optical apparatus according to claim 1 further comprising means for supporting a first object on said first plane, said illuminating means supplying said light beam so as to illuminate said first object, said first object being interposed between said illuminating means and one side of said objective optical system, and light receiving means at the opposite side of said objective optical system for producing information indicative of the position of an image of said first object formed by said objective optical system, said second plane being interposed between said light receiving means and said objective optical system.

6. An optical apparatus according to claim 5, wherein a second object is disposed adjacent to said second plane, and said determining means includes adjusting means for varying the length of an optical path between said first object and said second object to determine said position of said image in a direction of said optical axis on the basis of a plurality of bits of information produced with respect to said first and second data when the length of the optical path is varied to first and second lengths.

7. An optical apparatus according to claim 5 further comprising means for changing over the condition of said light beam arriving at said light receiving means between a first condition in which said light receiving means receives said part of said light beam passing through said first area of said exit pupil and a second condition in which said light receiving means receives said part of said light beam passing through said second area of said exit pupil.

8. An optical apparatus according to claim 7, wherein said changing over means includes selector means provided at a position equivalent to said pupil for directing to said light receiving means part of the light beam from said illuminating means which passes through a partial area on said pupil.

9. An optical apparatus according to claim 8 further comprising an imaging optical system at said opposite side of said objective optical system, and a second object adjacent to said second plane and interposed between said imaging optical system and said objective optical system, and said objective optical system, and wherein said selector means is disposed at a position conjugate with said pupil with respect to said imaging optical system.

10. An optical apparatus according to claim 8, wherein said selector means is provided between said light receiving means and said second plane.

11. An optical apparatus according to claim 8, wherein said selector means is provided between said illuminating means and said first plane.

* * * * *